United States Patent
Kao et al.

(10) Patent No.: US 7,839,684 B2
(45) Date of Patent: Nov. 23, 2010

(54) DEFECTIVE BLOCK HANDLING METHOD FOR A MULTIPLE DATA CHANNEL FLASH MEMORY STORAGE DEVICE

(75) Inventors: Yu-Mao Kao, Hsinchu (TW); Yung-Li Ji, Hsinchu (TW); Chih-Nan Yen, Hsinchu (TW); Fu-Ja Shone, Hsinchu (TW)

(73) Assignee: Skymedi Corporation, Hsinchu (TW)

( * ) Notice: Subject to any disclaimer, the term of this patent is extended or adjusted under 35 U.S.C. 154(b) by 120 days.

(21) Appl. No.: 12/382,204

(22) Filed: Mar. 11, 2009

(65) Prior Publication Data
US 2010/0232223 A1     Sep. 16, 2010

(30) Foreign Application Priority Data
Nov. 12, 2008    (TW) ............................. 97143691 A

(51) Int. Cl.
*G11C 16/00*    (2006.01)
(52) U.S. Cl. .............. 365/185.09; 365/185.11; 365/200
(58) Field of Classification Search ............. 365/185.02
See application file for complete search history.

(56) References Cited

U.S. PATENT DOCUMENTS 5,329,488 A * 7/1994 Hashimoto ............. 365/185.09
5,691,945 A * 11/1997 Liou et al. ................. 365/200

* cited by examiner

*Primary Examiner*—Tan T. Nguyen
(74) *Attorney, Agent, or Firm*—Rosenberg, Klein & lee

(57) ABSTRACT

The block groups of a multiple data channel flash memory storage device are detected for defective blocks. The block group containing any defective blocks is divided into subgroups, each of which contains only defective blocks or only good blocks. The subgroups containing only good blocks are selected to establish a new block group having the same amount of blocks as that of the original block groups.

5 Claims, 8 Drawing Sheets

DEFECTIVE BLOCK HANDLING METHOD FOR A MULTIPLE DATA CHANNEL FLASH MEMORY STORAGE DEVICE

FIELD OF THE INVENTION

The present invention is related generally to a multiple data channel flash memory storage device and, more particularly, to a defective block handling method for a multiple data channel flash memory storage device.

BACKGROUND OF THE INVENTION

The most efficient way of using a multiple data channel flash memory storage device is to use all its data channels simultaneously for data transmission. FIG. 1 is a simplified diagram showing an 8-channel flash memory storage device 10, which includes a flash control integrated circuit (IC) 28 and n+1 block groups BLK8[0], BLK8[1], BLK8[2], ..., BLK8[n], where 'n' is a natural number and the number in the brackets '[ ]' represents the physical block number of the block group. For example, as shown in FIG. 1, the block group BLK8[0] is located in the 0-th row and the block group BLK8[n] is located in the n-th row. Each of the block groups BLK8[0], BLK8[1], BLK8[2], ..., BLK8[n] contains eight blocks and therefore, the flash memory storage device 10 has eight data channels 12, 14, 16, 18, 20, 22, 24 and 26. When all the data channels at a location are good blocks, a fixed amount of data can be written into the location most efficiently. For this reason, the flash control IC 28 always groups the data into the size of a fixed amount as far as possibility, where the fixed amount of data refers to the data size receivable in one block group. In FIG. 1, each of the block groups BLK8[0], BLK8[1], BLK8[2], ..., BLK8[n] has eight blocks and is thus capable of accommodating the data size of eight blocks.

Unfortunately, the program/erase endurance of a flash memory is finite. Due to repeated access or defects already existing before delivery, it is very likely that some flash memory chips have more defective blocks than others. In a block group including any defective block, it is impossible to write data in the size of eight blocks. For example, assuming that each flash memory chip allows for 10,000 times of programming/erasing operations, when the flash memory storage device 10 executes the 9,000th time of programming/erasing operation, it may have only seven data channels remaining to be workable because there are too many defective blocks in the flash memory chips of some certain data channel. In this case, two traditional methods may be adopted: one is to have the flash memory storage device 10 enter into the read-only mode, and the other is to retire the flash memory storage device 10.

U.S. Pat. No. 6,345,367 issued to Sinclair proposed an alternative method, which records the locations of defective blocks in a record table so that those defective blocks can be skipped in write. However, this solution retards the write speed and consequently reduces efficiency.

Therefore, it is desired a mechanism to manage the good blocks in a flash memory storage device for further use therewith, so as to improve the efficiency and life of the flash memory storage device.

SUMMARY OF THE INVENTION

An object of the present invention is to provide a defective block handling method for a multiple data channel flash memory storage device to improve the flash memory storage device in both efficiency and life.

According to a defective block handling method of the present invention, block groups of a multiple data channel flash memory storage device are detected to identify the defective blocks therein, each of the block groups containing any defective blocks is divided into subgroups, each of which contains only defective blocks or only good blocks, and the subgroups containing only good blocks are selected to establish new block groups, each of which contains the same amount of blocks as that of the original block groups for data storage. As a result, the multiple data channel flash memory storage device is improved in both efficiency and life.

BRIEF DESCRIPTION OF THE DRAWINGS

These and other objects, features and advantages of the present invention will become apparent to those skilled in the art upon consideration of the following description of the preferred embodiments of the present invention taken in conjunction with the accompanying drawings, in which.

DETAILED DESCRIPTION OF THE INVENTION

Figure 1:
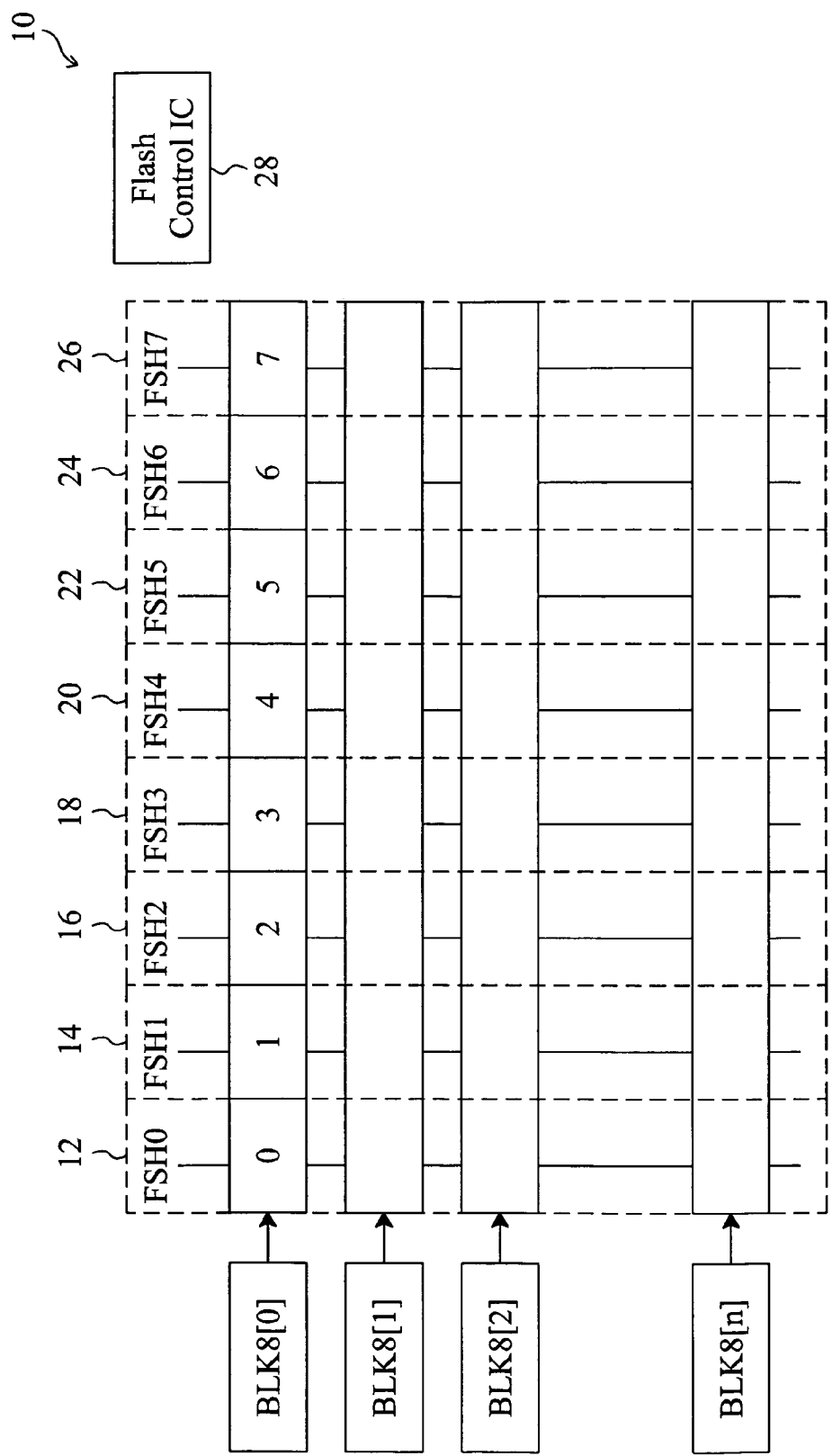
FIG. 1 is a diagram showing the configuration of an 8-channel flash memory storage device.
Figure 2:
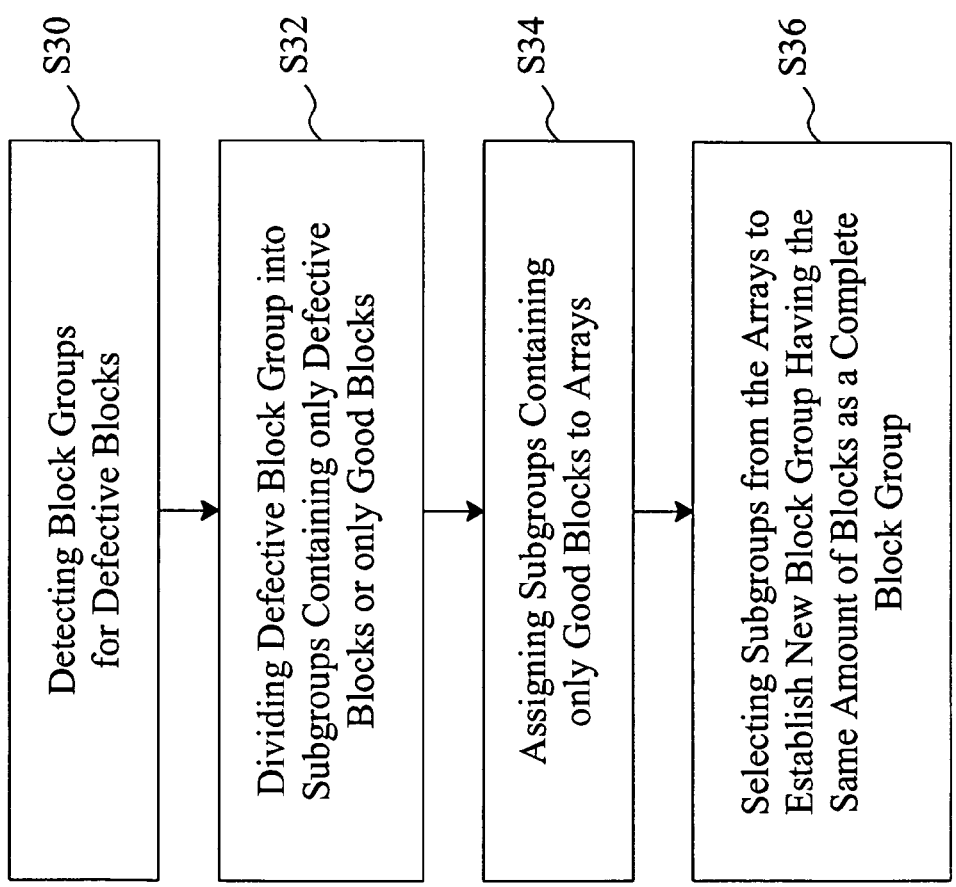
FIG. 2 is a diagram showing the flowchart of an embodiment according to the present invention.
Figure 3:
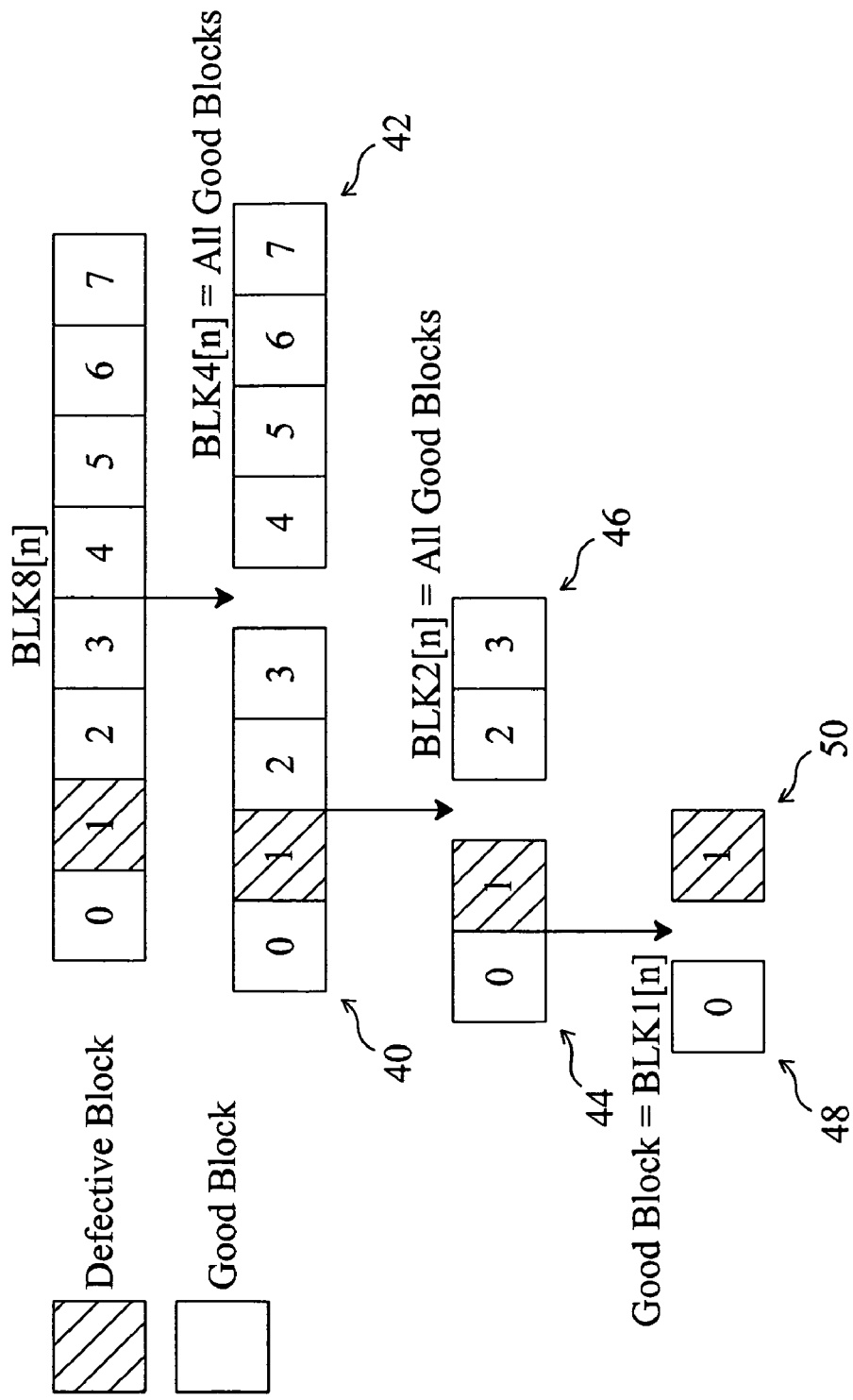
FIG. 3 is a diagram showing a division of a block group in an embodiment according to the present invention.
Figure 4:
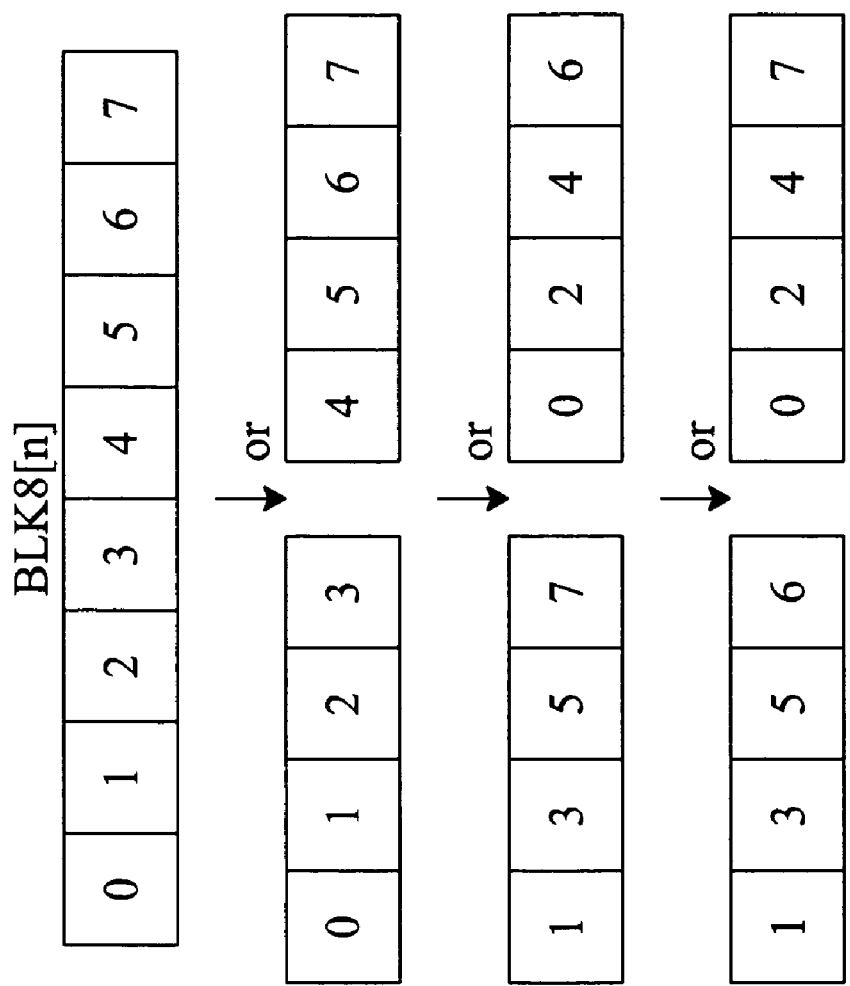
FIG. 4 is a diagram showing some possible ways of dividing a block group.

FIG. 2 shows a flowchart in an embodiment according to the present invention. For example, referring to FIG. 1, the multiple data channel flash memory storage device 10 includes several flash memory chips which are configured with n+1 block groups BLK8[0], BLK8[1], BLK8[2], ..., BLK8[n] and share a common chip enable pin. For the multiple data channel flash memory storage device 10, a defective block handling method in the embodiment of FIG. 2 detects each of the block groups BLK8[0], BLK8[1], BLK8[2], ..., BLK8[n] in step S30 for any defective blocks therein, and if there are any block groups including any defective blocks, in step S32, each defective block group is divided into subgroups. In particular, each of the subgroups contains only defective blocks or only good blocks. For example, as shown in FIG. 3, the block group BLK8[n] in the n-th row is divided by three steps for subgrouping the blocks thereof. The block group BLK8[n] has eight blocks originally and one of them is detected to be defective in the step S30. At first, the block group BLK8[n] is divided into two halves, namely subgroups 40 and 42. Then, the subgroups 40 and 42 are detected again, and the subgroup 40 is further divided into two halves, namely subgroups 44 and 46, since it has a defective block. Similarly, the subgroups 44 and 46 are detected again and the former is further divided into two halves, namely subgroups 48 and 50. Eventually, the block group BLK8[n] is divided into the four subgroups 42, 46, 48 and 50 in this embodiment. Each of the subgroups 42, 46, 48 contains only good blocks, and the subgroup 50 contains only defective block. In the division of a block group, it is not necessary to subgroup the blocks at adjacent locations as shown in FIG. 3. For example, as shown in FIG. 4, in the first division step, in addition to subgroup the blocks at adjacent locations, the block group BLK8[n] may be alternatively divided to be one subgroup including the blocks 1, 3, 5, 7 and the other including the blocks 0, 2, 4, 6, or to be one including the blocks 1, 3, 5, 6 and the other including the blocks 0, 2, 4, 7. More other ways of dividing a block group may be determined by the designers.

Figure 5:
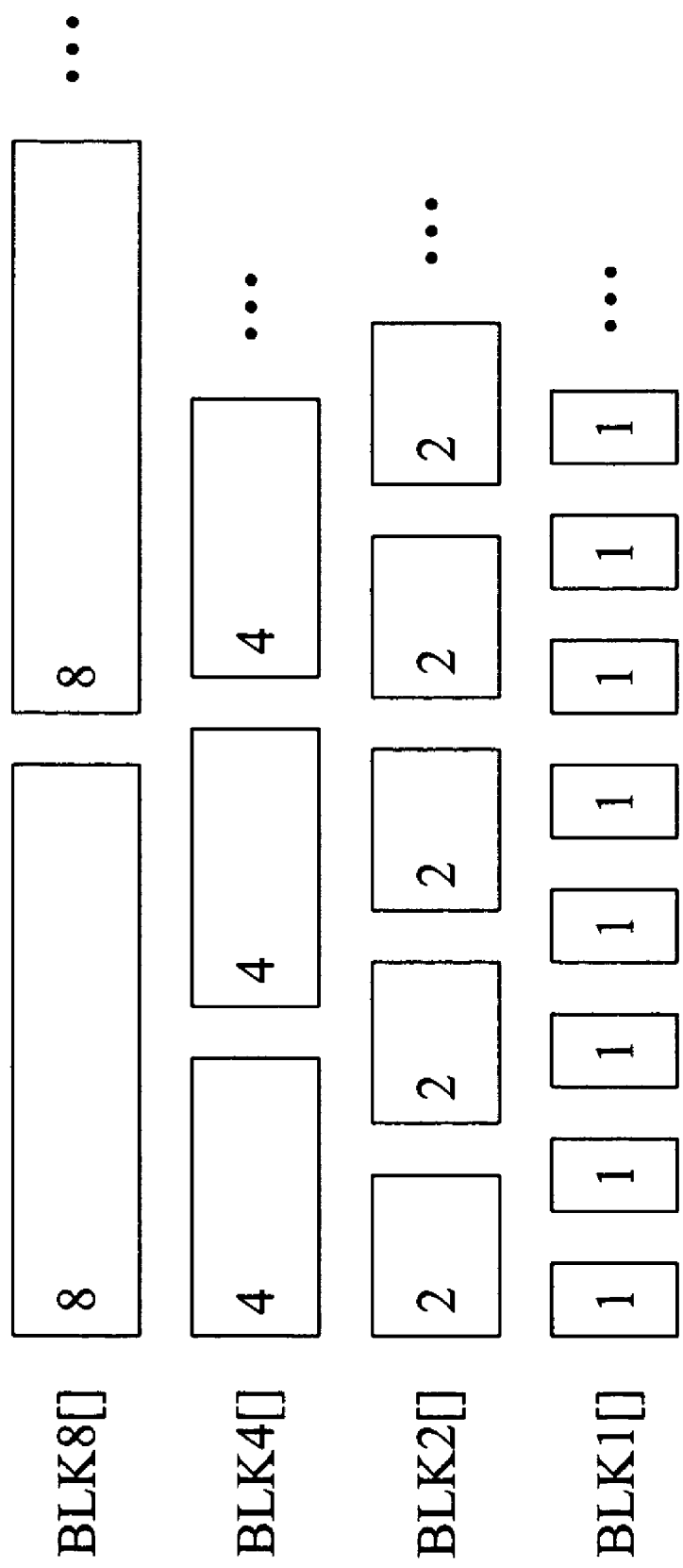
FIG. 5 is a diagram showing an assignment of subgroups to arrays.
Figure 6A:
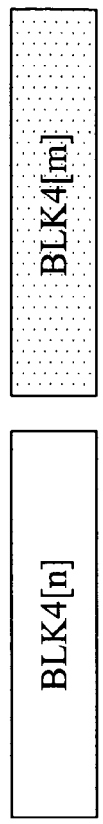
FIGS. 6A to 6C are diagrams showing a preferred method for combining subgroups to compose a block group.
Figure 6B:
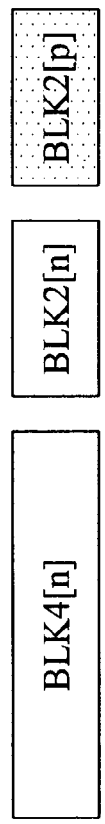
Figure 6C:
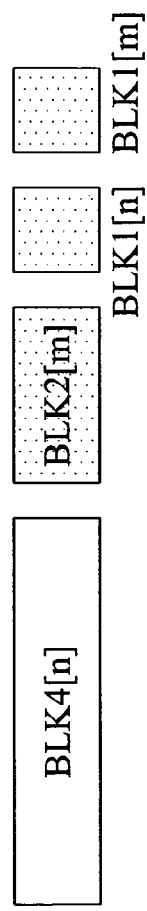

Referring back to FIG. 2, after dividing the original block groups into subgroups in the step S32, those subgroups containing only good blocks are assigned to arrays in step S34. For instance, as shown in FIG. 5, all the subgroups having four good blocks are assigned to an array BLK4[ ], all the subgroups having two good blocks are assigned to an array BLK2[ ], and all the subgroups having only one good block are assigned to an array BLK1[ ]. Consequently, after the step S34, there will be four arrays, BLK8[ ] for the subgroups having eight good blocks, BLK4[ ] for the subgroups having four good blocks, BLK2[ ] for the subgroups having two good blocks, and BLK1[ ] for the subgroups having only one good block. Then, in step S36, subgroups are selected from the arrays to establish new block-groups, each of which contains the same amount of blocks as that of the original block groups BLK8[0], BLK8[1], BLK8[2], . . . , BLK8[n]. In this embodiment, each original block group includes eight blocks and thus, the new block group will also have eight blocks. There are various approaches to establish new block groups by combining the subgroups, and FIGS. 6A to 6C show one of them, in which the subgroups having more good blocks are selected preferentially. As a new block group in this embodiment is composed of eight blocks, those subgroups in the array BLK8[ ] need not to be further merged. For a new block group, two of the subgroups having four blocks, for example BLK4[n] and BLK4[m] as shown in FIG. 6A, are first selected from the array BLK4[ ] to compose a complete block group having eight blocks. If the subgroups in the array BLK4[ ] are not enough to establish a complete block group, the subgroups in the array BLK2[ ] will be taken for mergence. For example, as shown in FIG. 6B, when there is only the subgroup BLK4[n] left in the array BLK4[ ], the subgroups BLK2[n] and BLK2[p] are taken from the array BLK2[ ] to be combined with the subgroup BLK4[n] to complete a new block group. Preferably, when selecting subgroups from the array BLK2[ ], the one having the same physical block number as that of the subgroup selected from the array BLK4[ ] will be selected preferentially. For example, as shown in FIG. 6B, the one selected from the array BLK4[ ] is BLK4[n] and thus, the subgroup BLK2[n] is selected preferentially. Similarly, when the subgroups left in the arrays BLK4[ ] and BLK2[ ] are not enough to establish a complete block group, the subgroups in the array BLK1 [ ] will be taken for mergence. For example, as shown in FIG. 6C, there is only the subgroup BLK4[n] left in the array BLK4[ ] and there is only the subgroup BLK2[m] left in the array BLK2[ ], two subgroups will be taken from the array BLK1[ ]. Preferably, the subgroups BLK1[n] and BLK1[m] will be selected preferentially, since they have the same physical block numbers 'n' and 'm' as those of the subgroups BLK4[n] and BLK2[m].

Figure 7:
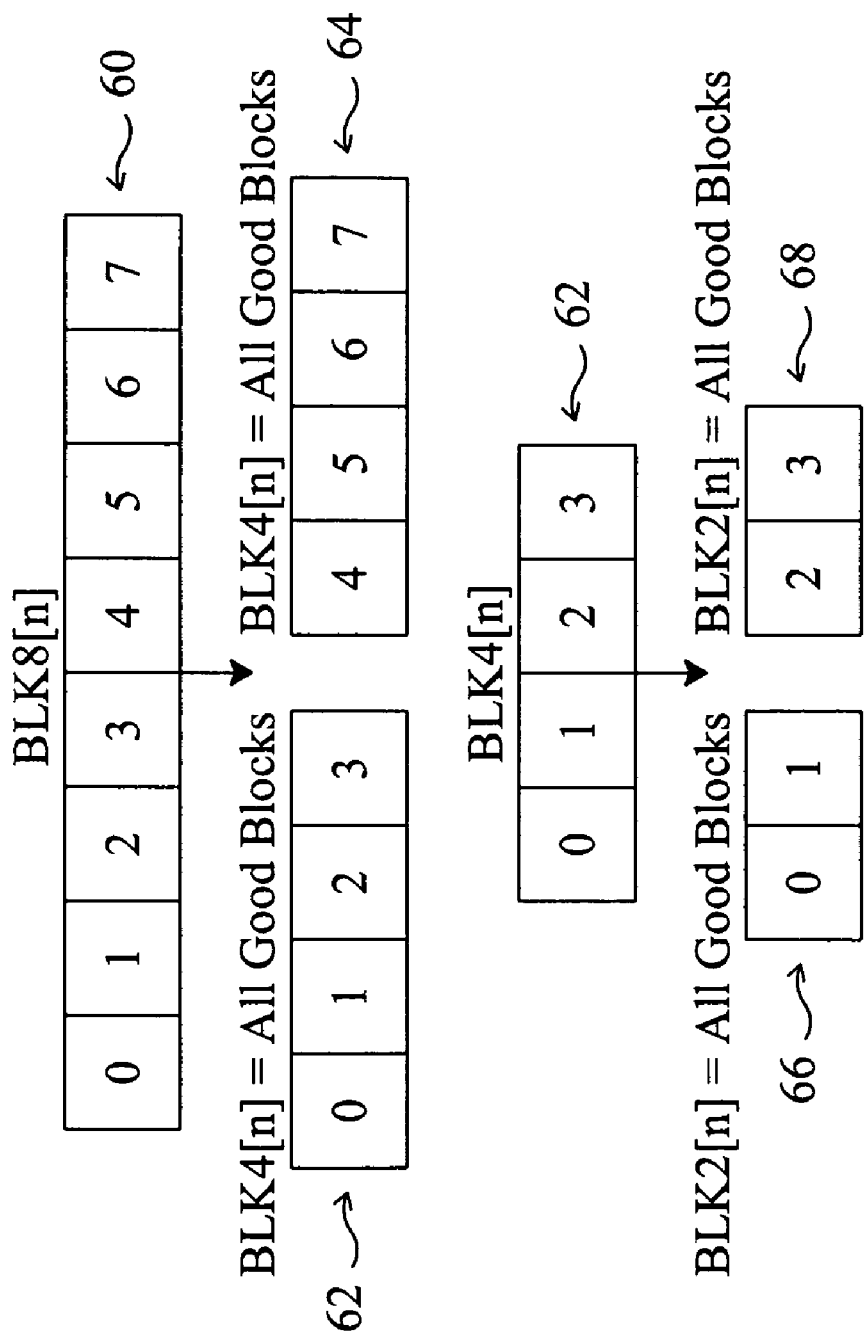
FIG. 7 is a diagram showing the process of a half-and-half division of a complete block group.
Figure 8:
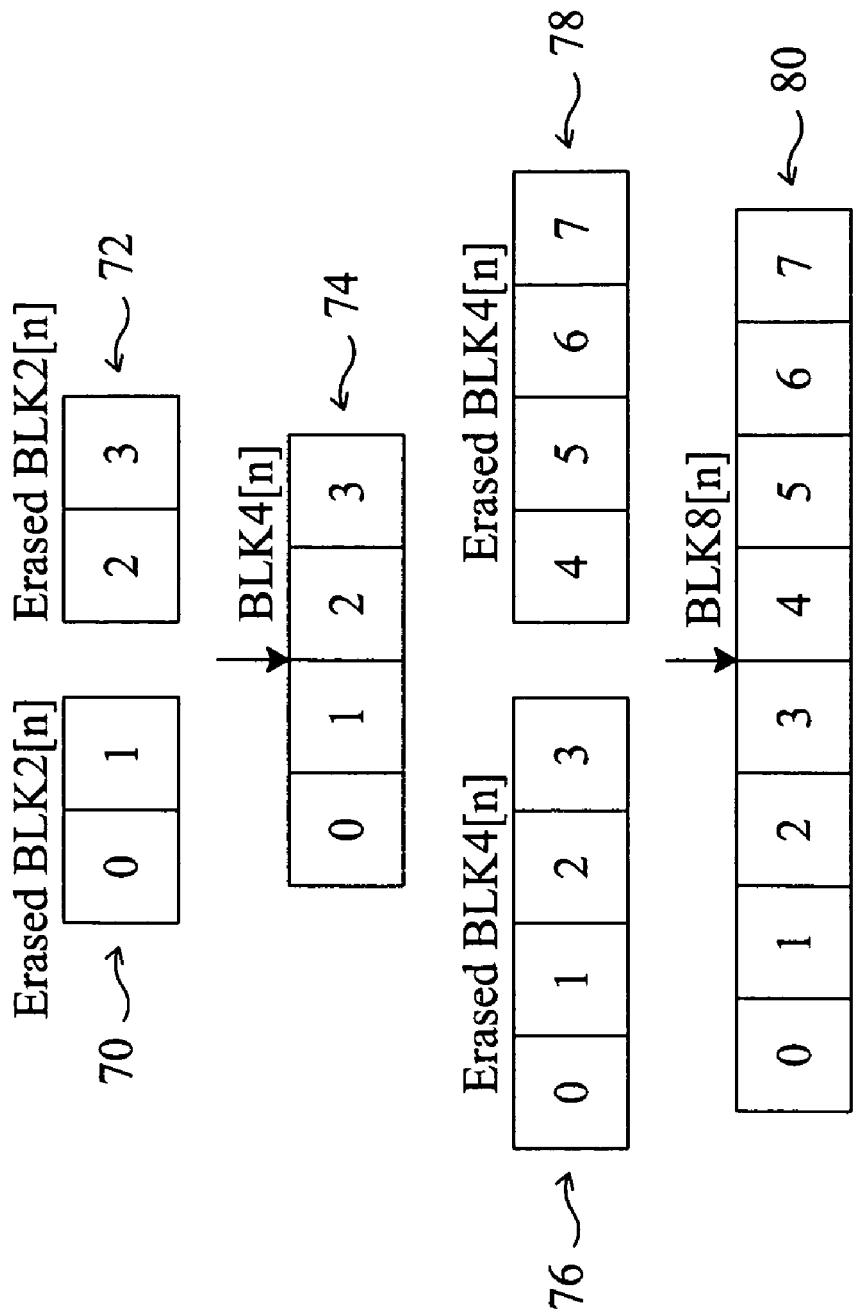
FIG. 8 is a diagram showing the process of a mergence of adjacent subgroups.

Those left subgroups insufficient for composing a complete block group having eight blocks can be temporarily laid aside until more subgroups are available. Alternatively, a complete block group may be divided into two halves so as to quickly compose a block group that will use less times of the chip enable pin. For example, FIG. 7 shows the process of a half-and-half division of a complete block group 60 containing no defective blocks, in which the block group 60 is divided into two subgroups 62 and 64, each having four blocks. If necessary, the subgroup 62 may be further divided into two halves, namely, subgroups 66 and 68, each having two blocks. After a period of use, there may be block groups erased in the flash memory storage device. If any two adjacent subgroups have been erased, they could be merged and assigned to a corresponding array. For example, FIG. 8 shows the process of a mergence of adjacent subgroups, in which two adjacent, erased subgroups 70 and 72, each having two blocks, are merged into a subgroup 74 having four blocks. Similarly, two adjacent, erased subgroups 76 and 78, each having four blocks, could be merged into a complete block group 80 having eight blocks.

While the present invention has been described in conjunction with preferred embodiments thereof, it is evident that many alternatives, modifications and variations will be apparent to those skilled in the art. Accordingly, it is intended to embrace all such alternatives, modifications and variations that fall within the spirit and scope thereof as set forth in the appended claims.

What is claimed is:

1. A defective block handling method for a multiple data channel flash memory storage device including a plurality of first block groups for data storage, comprising the steps of:
   A. detecting the plurality of first block groups for defective blocks therein;
   B. dividing the first block groups containing any defective blocks into a plurality of subgroups, each of which contains only defective blocks or only good blocks; and
   C. selecting the subgroups containing only good blocks to establish one or more second block groups, each of which contains a same amount of blocks as that of the plurality of first block groups.

2. The defective block handling method of claim 1, wherein the step B comprises the steps of:
   B1. dividing a first block group containing any defective blocks into two halves as two subgroups;
   B2. detecting the subgroups produced in the step B1 for defective blocks;
   B3. dividing the subgroup containing any defective blocks into two halves as more subgroups; and
   B4. repeating the steps B2 and B3 until each of the subgroups contains only defective blocks or only good blocks.

3. The defective block handling method of claim 1, further comprising the step of detecting locations of the defective blocks to determine how the block group containing any defective blocks is divided.

4. The defective block handling method of claim 1, wherein the step C comprises the step of preferentially selecting the subgroup having more good blocks to establish the second block group.

5. The defective block handling method of claim 4, wherein the subgroup having a physical block number identical to that of the subgroup that have been selected is selected preferentially when more than one subgroup having a same amount of blocks are available.

* * * * *